US011587966B2

(12) United States Patent
Feng et al.

(10) Patent No.: US 11,587,966 B2
(45) Date of Patent: Feb. 21, 2023

(54) FINGERPRINT ACQUISITION APPARATUS, DISPLAY PANEL AND ELECTRONIC DEVICE

(71) Applicants: BEIJING BOE SENSOR TECHNOLOGY CO., LTD., Beijing (CN); BOE TECHNOLOGY GROUP CO., LTD., Beijing (CN)

(72) Inventors: Yajie Feng, Beijing (CN); Cheng Li, Beijing (CN); Yue Geng, Beijing (CN); Kuiyuan Wang, Beijing (CN); Chaoyang Qi, Beijing (CN); Yi Dai, Beijing (CN); Zefei Li, Beijing (CN)

(73) Assignees: Beijing BOE Sensor Technology Co., LTD, Beijing (CN); BOE Technology Group Co., LTD., Beijing (CN)

( * ) Notice: Subject to any disclaimer, the term of this patent is extended or adjusted under 35 U.S.C. 154(b) by 0 days.

(21) Appl. No.: 17/402,670

(22) Filed: Aug. 16, 2021

(65) Prior Publication Data

US 2022/0165772 A1 May 26, 2022

(30) Foreign Application Priority Data

Nov. 23, 2020 (CN) .......................... 202011323162.0

(51) Int. Cl.
*G01J 1/44* (2006.01)
*H01L 27/146* (2006.01)
*G06V 40/13* (2022.01)

(52) U.S. Cl.
CPC .......... *H01L 27/14623* (2013.01); *G01J 1/44* (2013.01); *G06V 40/1318* (2022.01); *H01L 27/14603* (2013.01)

(58) Field of Classification Search
CPC .. G01J 1/44; H01L 29/78633; H01L 27/3227; H01L 27/3234; H01L 27/14887
USPC .................................. 257/E29.291, E27.162
See application file for complete search history.

(56) References Cited

U.S. PATENT DOCUMENTS

| 2002/0054394 A1* | 5/2002 | Sasaki ............... H01L 29/78633 257/E29.291 |
| 2008/0203278 A1* | 8/2008 | Harada ............. H01L 27/14887 257/E27.162 |
| 2021/0200366 A1* | 7/2021 | Bok ..................... H01L 27/3234 |
| 2022/0034712 A1* | 2/2022 | Tago ......................... G01J 1/44 |
| 2022/0131018 A1* | 4/2022 | Jeon .................... H01L 27/3227 |

* cited by examiner

*Primary Examiner* — Abdul-Samad A Adediran
(74) *Attorney, Agent, or Firm* — Fay Sharpe LLP

(57) ABSTRACT

A fingerprint acquisition apparatus includes a plurality of photoelectric conversion units and a first shading pattern. The first shading pattern includes at least one first shading block including a first opening, and an orthographic projection of the first opening in the first shading block on the base substrate is within an orthographic projection of a target photoelectric conversion unit corresponding to the first shading block on the base substrate.

18 Claims, 15 Drawing Sheets

FINGERPRINT ACQUISITION APPARATUS, DISPLAY PANEL AND ELECTRONIC DEVICE

CROSS-REFERENCE TO RELATED APPLICATION

This application is based on and claims priority to the Chinese Patent Application No. 202011323162.0, filed on Nov. 23, 2020 and entitled "FINGERPRINT ACQUISITION APPARATUS AND ELECTRONIC DEVICE," the disclosure of which is incorporated herein by reference in its entirety.

TECHNICAL FIELD

The present disclosure relates to the field of sensing technologies, and in particular, relates to a fingerprint acquisition apparatus, a display panel, and an electronic device.

BACKGROUND

A fingerprint acquisition apparatus is a device capable of acquiring fingerprint information, and various functions such as security verification can be subsequently implemented based on the acquired fingerprint information.

A fingerprint acquisition apparatus includes a base substrate as well as a light-emitting unit, a prism structure and a fingerprint sensor which are disposed on the base substrate. The light-emitting unit emits light outwards, and the light is reflected to the prism structure when being irradiated on a finger, and then the light is guided to the fingerprint sensor by the prism structure. The prism structure prevents external high-intensity light from being directly irradiated onto the prism structure and causing the prism structure to malfunction, thereby implementing a high-intensity light-resistant function.

SUMMARY

Embodiments of the present disclosure provide a fingerprint acquisition apparatus, a display panel, and an electronic device.

According to a first aspect of the embodiments of the present disclosure, a fingerprint acquisition apparatus is provided. The fingerprint acquisition apparatus includes:

a base substrate;

a plurality of photovoltaic conversion units disposed on the base substrate; and a first shading pattern disposed on the base substrate, wherein the first shading pattern includes at least one first shading block corresponding to at least one target photoelectric conversion unit of the plurality of photoelectric conversion units, the first shading block including a first opening, wherein an orthographic projection of the first opening in the first shading block on the base substrate is within an orthographic projection of a target photoelectric conversion unit corresponding to the first shading block on the base substrate.

In some embodiments, the fingerprint acquisition apparatus further includes a second shading pattern disposed on the base substrate, wherein the second shading pattern includes at least one second shading block corresponding to the at least one first shading block, the second shading block including a second opening, wherein a positional relationship between an orthographic projection of the second opening in the second shading block on the base substrate and an orthographic projection of the first opening in the first shading block corresponding to the second shading block on the base substrate sati sties any one of the following conditions:

the orthographic projection of the second opening in the second shading block on the base substrate is connected to the orthographic projection of the first opening in the first shading block corresponding to the second shading block on the base substrate; and the orthographic projection of the second opening in the second shading block on the base substrate is overlapped with the orthographic projection of the first opening in the first shading block corresponding to the second shading block on the base substrate.

In some embodiments, a gap is defined between the first shading pattern and the second shading pattern in a direction perpendicular to the base substrate.

In some embodiments, the fingerprint acquisition apparatus further includes a transparent spacer layer disposed between the first shading pattern and the second shading pattern.

In some embodiments, a shape of the first opening in the first shading block is the same as a shape of the second opening in the second shading block, and a size of the first opening in the first shading block is equal to a size of the second opening in the second shading block.

In some embodiments, the first shading block further includes at least one third opening, wherein an orthographic projection of the at least one third opening on the base substrate is within an orthographic projection of the target photoelectric conversion unit on the base substrate.

In some embodiments, the second shading block further includes at least one fourth opening in one-to-one correspondence with the at least one third opening, wherein a positional relationship between an orthographic projection of the fourth opening on the base substrate and an orthographic projection of the third opening corresponding to the fourth opening on the base substrate satisfies any one of the following conditions:

the orthographic projection of the fourth opening on the base substrate is connected to the orthographic projection of the third opening corresponding to the fourth opening on the base substrate; and the orthographic projection of the fourth opening on the base substrate is overlapped with the orthographic projection of the third opening corresponding to the fourth opening on the base substrate.

In some embodiments, each of the plurality of photoelectric conversion units is the target photoelectric conversion unit.

In some embodiments, the fingerprint acquisition apparatus further includes: a transparent insulation layer disposed on the base substrate; and a transparent conductive layer disposed on the base substrate, wherein the transparent conductive layer is electrically connected to a grounding point.

In some embodiments, the fingerprint acquisition apparatus further includes a plurality of thin film transistors disposed on the base substrate; wherein each of the thin film transistors includes a first electrode, a second electrode, and a third electrode configured to control connection or disconnection between the first electrode and the second electrode, wherein the second electrode is electrically connected to one of the plurality of photoelectric conversion units.

In some embodiments, the fingerprint acquisition apparatus further includes a common electrode disposed on the base substrate, wherein the common electrode is electrically connected to the plurality of photoelectric conversion units.

In some embodiments, a material of the first shading pattern includes metal, and the first shading pattern is disposed on the common electrode and electrically connected to the common electrode.

In some embodiments, the fingerprint acquisition apparatus further includes a backlight plate disposed on one side, distal from the plurality of photoelectric conversion units, of the base substrate; wherein a material of the second electrode includes a shading conductive material, the photoelectric conversion unit electrically connected to the second electrode is disposed on the second electrode; and an orthographic projection of the photoelectric conversion unit electrically connected to the second electrode on the backlight plate is within an orthographic projection of the second electrode on the backlight plate.

In some embodiments, the backlight plate includes a light guide plate and a light-emitting unit disposed on one side of the light guide plate.

In some embodiments, the fingerprint acquisition apparatus further includes: a control assembly, and a control circuit board disposed on one side, distal from the base substrate, of the backlight plate; wherein the control circuit board is electrically connected to the backlight plate and the control assembly and configured to control the backlight plate and the control assembly, and the control assembly is further electrically connected to the plurality of thin film transistors and configured to control the plurality of thin film transistors.

In some embodiments, the fingerprint acquisition apparatus further includes: a shading sheet arranged on the same layer as the third electrode, wherein an orthographic projection of the photoelectric conversion unit electrically connected to the second electrode on the backlight plate is within an orthographic projection of the shading sheet on the backlight plate.

In some embodiments, a material of the first shading pattern and a material of the second shading pattern include any one of: molybdenum, aluminum, and a composite metal of molybdenum and aluminum.

According to another aspect of the embodiments of the present disclosure, a display panel is provided. The display panel includes: a plurality of pixels and a fingerprint acquisition apparatus. The fingerprint acquisition apparatus includes:

a base substrate;

a plurality of photoelectric conversion units disposed on the base substrate; and a first shading pattern disposed on the base substrate;

wherein the first shading pattern includes at least one first shading block corresponding to at least one target photoelectric conversion unit of the plurality of photoelectric conversion units, the first shading block including a first opening, wherein an orthographic projection of the first opening in the first shading block on the base substrate is within an orthographic projection of a target photoelectric conversion unit corresponding to the first shading block on the base substrate.

According to still another aspect of the embodiments of the present disclosure, an electronic device. The electronic device includes a display panel and a power supply assembly. The power supply assembly is electrically connected to the display panel and configured to supply power to the display panel.

The display panel includes: a plurality of pixels and a fingerprint acquisition apparatus, wherein the fingerprint acquisition apparatus includes:

a base substrate;

a plurality of photoelectric conversion units disposed on the base substrate; and a first shading pattern disposed on the base substrate;

wherein the first shading pattern includes at least one first shading block corresponding to at least one target photoelectric conversion unit of the plurality of photoelectric conversion units, the first shading block including a first opening, wherein an orthographic projection of the first opening in the first shading block on the base substrate is within an orthographic projection of a target photoelectric conversion unit corresponding to the first shading block on the base substrate.

BRIEF DESCRIPTION OF THE DRAWINGS

For clearer descriptions of the technical solutions in the embodiments of the present disclosure, the following briefly describes the accompanying drawings required for describing the embodiments. Apparently, the accompanying drawings in the following description show merely some embodiments of the present disclosure, and other drawings may be derived by persons skilled in the art from these accompanying drawings without creative efforts.

The above accompanying drawings have shown specific embodiments of the present disclosure, and are to be described in detail as follows. These accompanying drawings and text descriptions are not intended in any way to limit the scope of the concept of the present disclosure, but to illustrate the conception of the present disclosure for those skilled in the art with reference to specific embodiments.

DETAILED DESCRIPTION

For clearer descriptions of the objectives, technical solutions, and advantages of the present disclosure, embodiments of the present disclosure are described in detail hereinafter with reference to the accompanying drawings.

Fingerprints refer to prints formed by concave and convex skin on fingertips of human fingers (a convex part is called a ridge, a concave part is called a valley, and prints between ridges and valleys can form fingerprints of fingers). Usually, each person's fingerprint is unique. Therefore, the function of security verification can be implemented by comparison of fingerprints.

In fingerprint-related technologies, an important process is acquisition of fingerprints. A fingerprint acquisition apparatus uses an optical technology to acquire fingerprints. The intensity of external light (such as sunlight or light emitted from various types of lighting sources) may be too strong for such a fingerprint acquisition apparatus, and in response to the external high-intensity light being directly irradiated on a sensor in the fingerprint acquisition apparatus, light energy received by the sensor in unit time may far exceed the maximum threshold of light energy which can be received by the sensor. As a result, the fingerprint acquisition apparatus cannot acquire fingerprints normally, that is, the fingerprint acquisition apparatus cannot work normally. A solution for this problem is provided as shown in FIG. 1.

Figure 1:
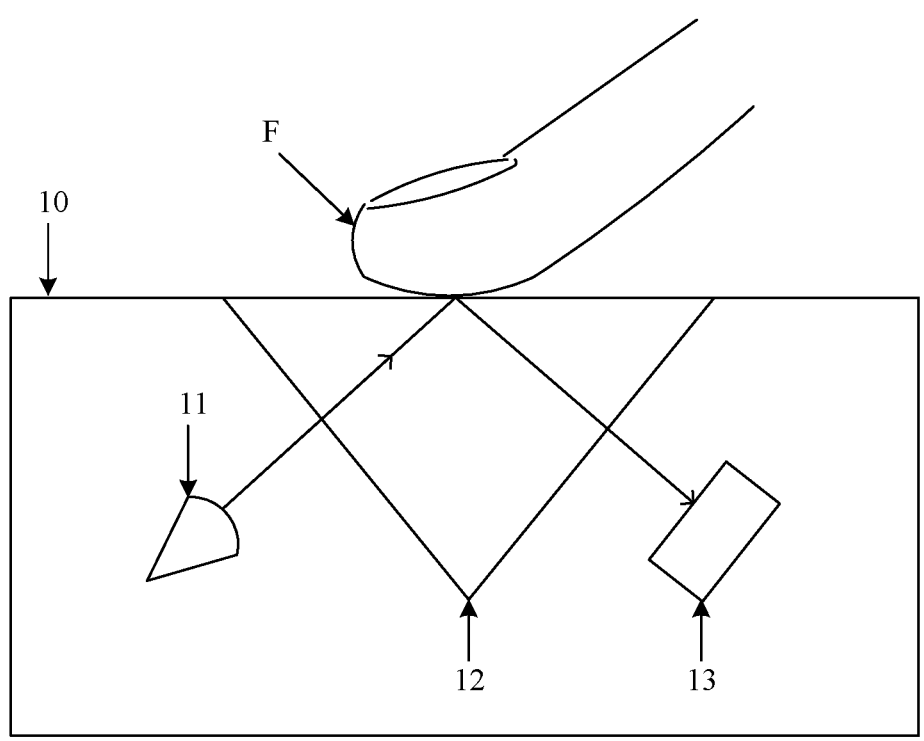
FIG. 1 is a schematic diagram of a principle of a fingerprint acquisition apparatus.

FIG. 1 is a schematic diagram of a principle of a fingerprint acquisition apparatus. The fingerprint acquisition apparatus 10 includes a light source 11, a prism 12, and a fingerprint sensor 13.

The prism 12 includes three sides. In response to a finger F pressing a first side of the prism 12, a light beam emitted from the light source 11 is irradiated on a second surface of the prism 12 and the finger F. Then, the light beam is reflected by the finger F, and emitted from a third surface of the prism 12 to the fingerprint sensor 13, which may be an image sensor, disposed outside the third surface of the prism 12. Therefore, the fingerprint sensor 13 can acquire information about prints of the finger F. In some embodiments, the image sensor may be a charge-coupled device (CCD).

Due to a light path formed by the light source 11, the prism 12 and the fingerprint sensor 13, direct irradiation of external high-intensity light is prevented. However, the size of the prism 12 is usually large, and the light path formed by the light source 11, the prism 12 and the fingerprint sensor 13 has strict requirements for their positions. As a result, an overall size and thickness of the fingerprint acquisition apparatus 10 are large, and the fingerprint acquisition apparatus 10 cannot be applicable to various thin devices, and its applicable range is more narrow.

Figure 2:
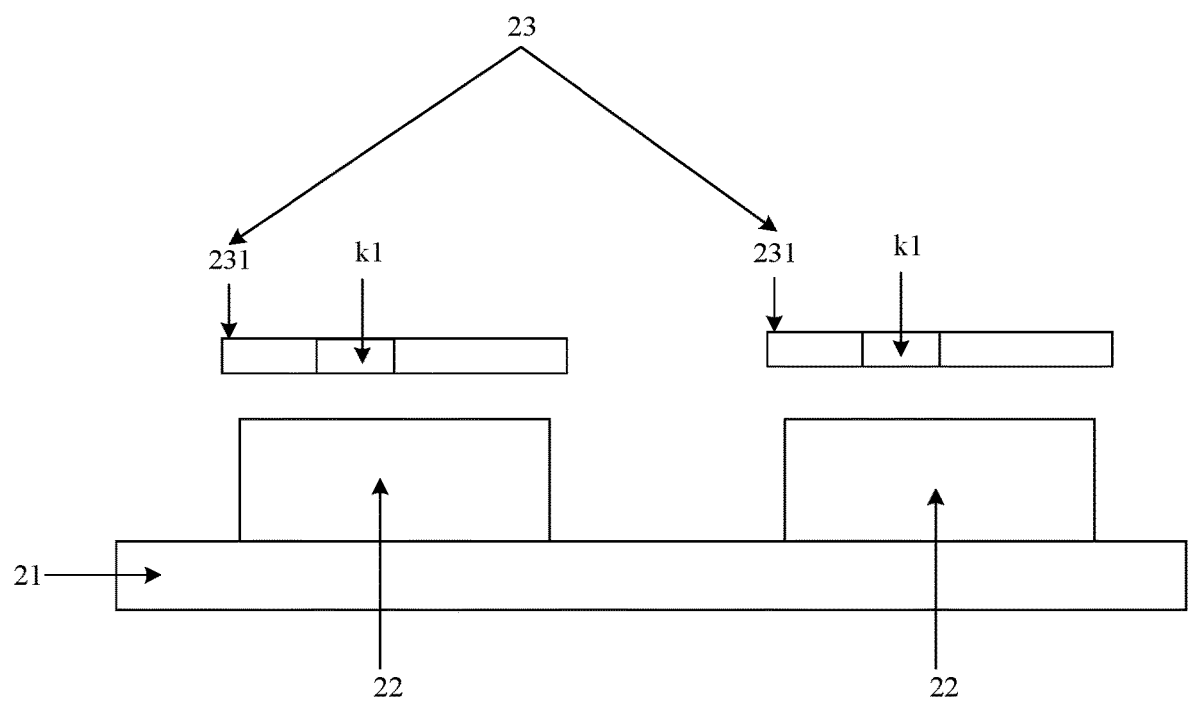
FIG. 2 is a schematic structural diagram of a fingerprint acquisition apparatus according to an embodiment of the present disclosure.

Embodiments of the present disclosure provide a fingerprint acquisition apparatus and an electronic device, which can implement fingerprint acquisition. An overall structure of the fingerprint acquisition apparatus is simple, and the fingerprint acquisition apparatus can be applicable to various thin devices conveniently. Therefore, an applicable range of the apparatus is greatly enlarged. FIG. 2 is a schematic structural diagram of a fingerprint acquisition apparatus according to an embodiment of the present disclosure. As shown in FIG. 2, the fingerprint acquisition apparatus 20 includes:

a base substrate 21;

a plurality of photoelectric conversion units 22 disposed on the base substrate 21; and a first shading pattern 23 disposed on the base substrate 21.

The first shading pattern 23 includes at least one first shading block 231 corresponding to at least one target photoelectric conversion unit 22 of the plurality of photoelectric conversion units 22. The first shading block 231 includes a first opening k1. An orthographic projection of the first opening k1 in each first shading block 231 on the base substrate 21 is within an orthographic projection of a target photoelectric conversion unit 22 corresponding to the first shading block 231 on the base substrate 21, that is, some or all of the light passing through the first opening Id may be irradiated on the target photoelectric conversion unit 22. The first opening k1 may be an opening corresponding to the target photoelectric conversion unit 22.

It should be noted that, the target photoelectric conversion unit 22 may be one type of photoelectric conversion units in the plurality of photoelectric conversion units 22. This type of photoelectric conversion units have corresponding first shading blocks 231 in the first shading pattern 23, that is, among the plurality of photoelectric conversion units, there may be some photoelectric conversion units 22 that do not have corresponding first shading blocks 231. Alternatively, each of the plurality of photoelectric conversion units 22 is the target photoelectric conversion unit. In this case, each of the plurality of photoelectric conversion units 22 includes a corresponding first shading block 23/ in the first shading pattern 23 (this structure is shown in FIG. 2).

A material of the photoelectric conversion units 22 may include a photoelectric conversion material. The photoelectric conversion material is a material that can convert light energy into electric energy through the photovoltaic effect.

Ridges and valleys of a finger reflect light with different intensities due to differences in shape and height. The fingerprint acquisition apparatus according to this embodiment of the present disclosure includes a plurality of photoelectric conversion units 22. Light received by the plurality of photoelectric conversion units 22 may be reflected by different areas of the finger. Then, the fingerprint acquisition apparatus can reliably determine prints of the ridges and valleys of the finger based on parameters of the light reflected by the different areas, such as intensity.

Figure 3:
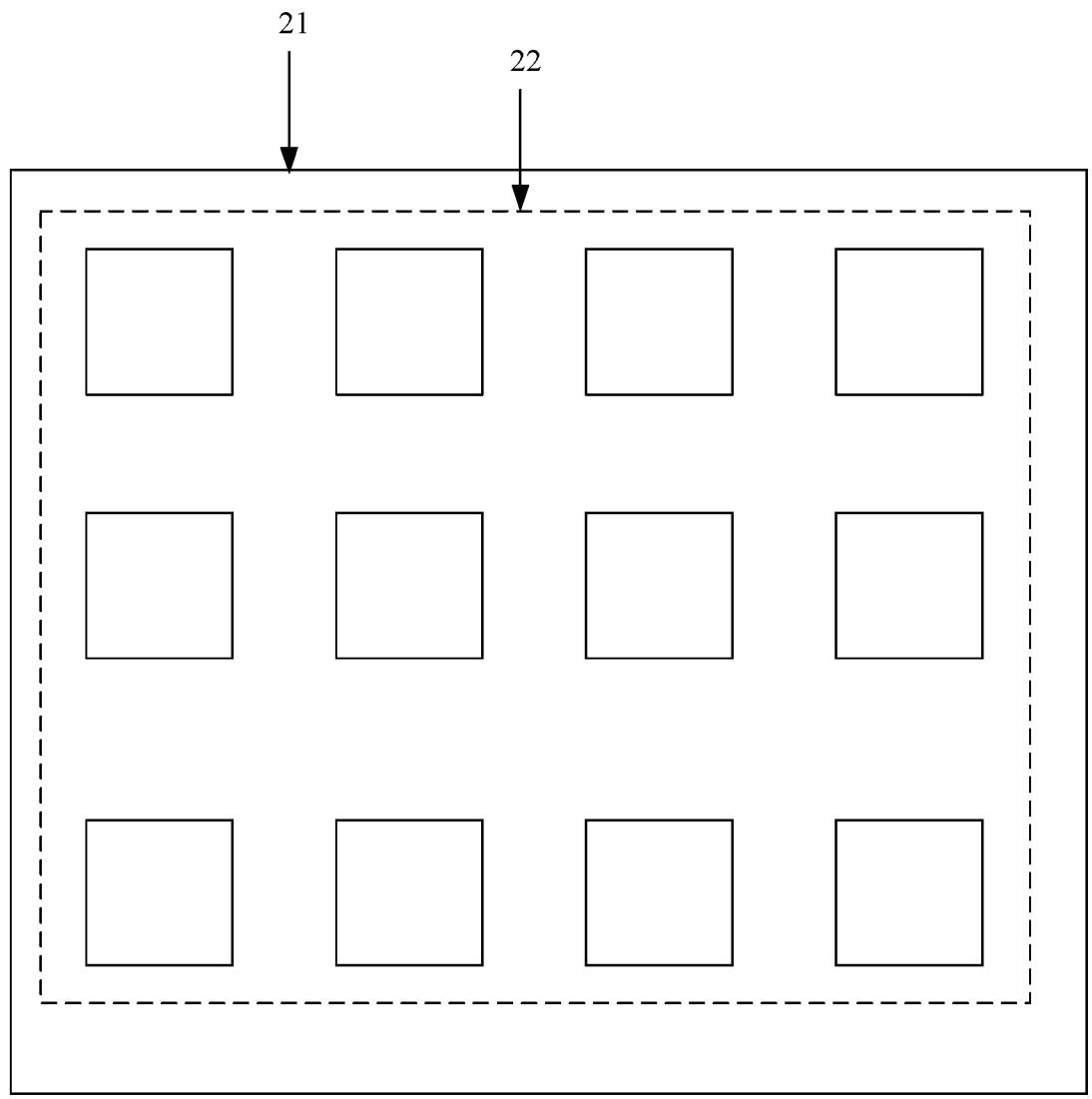
FIG. 3 is a schematic structural top view of the fingerprint acquisition apparatus shown in FIG. 2.

For example, as shown in FIG. 3, FIG. 3 is a schematic structural top view of the fingerprint acquisition apparatus shown in FIG. 2 (to show the photoelectric conversion unit clearly, the first shading pattern is not shown in FIG. 3). Referring to FIG. 3, the plurality of photoelectric conversion units 22 may be arranged on the base substrate 21 in an array, for example, arranged on the base substrate 21 in a plurality of rows and columns. Correspondingly, openings corresponding to the photoelectric conversion units 22 may also be disposed on the first shading pattern 23. In this way, accurate fingerprint information can be acquired.

"Fingerprint" in this embodiment of the present disclosure does not refer to the fingerprint in a narrow sense. The fingerprint may include not only prints on a fingertip, but also prints on a knuckle, a palm, and other human body parts. This is not limited in the embodiments of the present disclosure.

In summary, the fingerprint acquisition apparatus according to this embodiment of the present disclosure includes the photoelectric conversion units and the shading pattern on the photoelectric conversion units; and the shading pattern includes openings. As the shading pattern shields a large area of the photoelectric conversion units, light can only be irradiated on the photoelectric conversion units through the openings. In this way, the light irradiated on the photoelectric conversion units is greatly reduced, and the energy of light radiated on the photoelectric conversion units does not exceed the maximum threshold which can be accepted by the photoelectric conversion units, thus a high-intensity light-resistant capability of the fingerprint acquisition apparatus is improved. Furthermore, it reduces the possibility that the photoelectric conversion units malfunction when external high-intensity light is irradiated on them.

In addition, because the fingerprint acquisition apparatus does not require any prism or prism-based light path, that is, the fingerprint acquisition apparatus does not require any prism structure to resist high-intensity light, an overall structure of the fingerprint acquisition apparatus is simpler, smaller and thinner. Therefore, the fingerprint acquisition apparatus can be applicable to various thin devices conveniently, and its applicable range is greatly enlarged. In other words, a problem of large overall size and thickness of a fingerprint acquisition apparatus in the related art is solved, and an overall thickness of the fingerprint acquisition apparatus is reduced.

Figure 4:
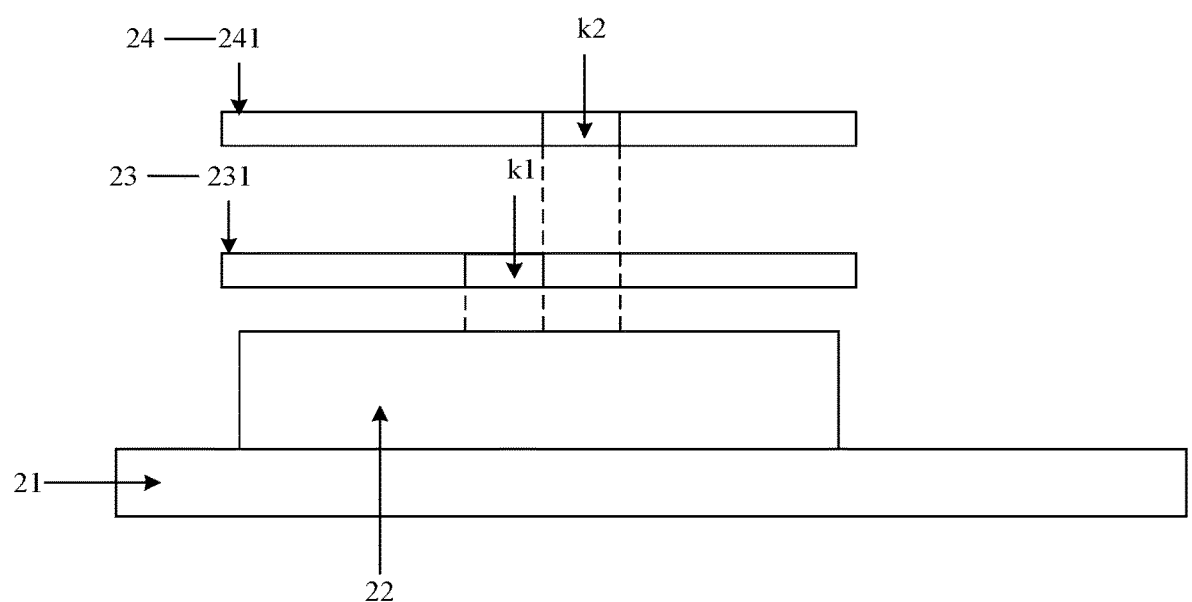
FIG. 4 is a schematic structural diagram of another fingerprint acquisition apparatus according to an embodiment of the present disclosure.

FIG. 4 is a schematic structural diagram of still another fingerprint acquisition apparatus according to an embodiment of the present disclosure. The fingerprint acquisition apparatus is adjusted based on the fingerprint acquisition apparatus shown in FIG. 1.

In some embodiments, referring to FIG. 4, the fingerprint acquisition apparatus 20 may further include a second shading pattern 24 disposed on the base substrate 21, wherein the second shading pattern 24 includes at least one second shading block 241 corresponding to the at least one first shading block 231, and the second shading block 241 includes a second opening k2.

An orthographic projection of the second opening k2 in each second shading block 241 on the base substrate 21 is connected to an orthographic projection of the first opening k1 in the first shading block 231 corresponding to the second shading block 241 on the base substrate 21. (In this structure, the first opening k1 and the second opening k2 are just staggered.) For example, referring to a structure shown in FIG. 4, the orthographic projection of the second opening k2 on the base substrate 21 is connected to the orthographic projection of the first opening k1 on the base substrate 21.

Figure 5:
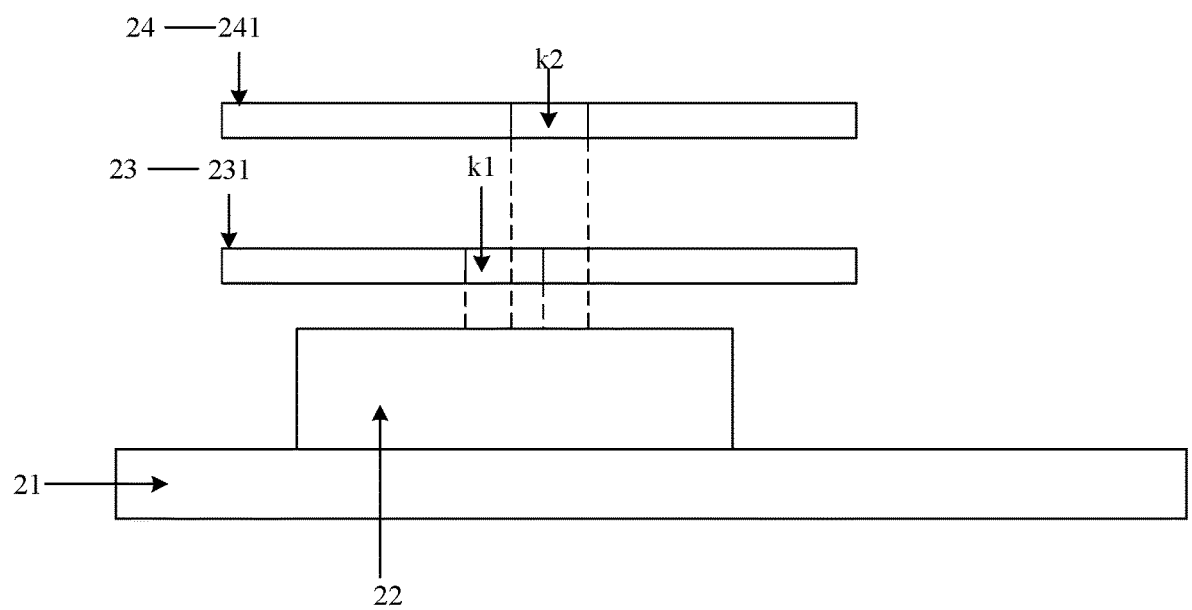
FIG. 5 is a schematic structural diagram of still another fingerprint acquisition apparatus according to an embodiment of the present disclosure.

Alternatively, the orthographic projection of the second opening k2 in each second shading block 241 on the base substrate 21 is overlapped with the orthographic projection of the first opening k1 in the first shading block 231 corresponding to the second shading block 241 on the base substrate 21. (In this structure, in response to the first opening k1 being identical to the second opening k2 in size and shape, they may overlap completely or partially.) For example, referring to FIG. 5, the orthographic projection of the second opening k2 on the base substrate 21 is overlapped with the orthographic projection of the first opening k1 on the base substrate 21.

In this way, the energy of light received by the photoelectric conversion units 22 in unit time can be adjusted by adjusting relative positions of the second opening k2 and first opening k1.

For example, the smaller overlapping areas between the second opening k2 and the first opening k1 (the overlapped regions between the second opening k2 and the first opening k1 in this embodiment of the present disclosure refer to overlapping regions between the orthographic projection of the second opening k2 on the base substrate and the orthographic projection of the first opening k1 on the base substrate), the less energy of light can be received by the photoelectric conversion units 22 in unit time. Correspondingly, the larger the overlapping regions between the second opening k2 and the first opening k1, the more energy of light can be received by the photoelectric conversion units 22 in unit time. On this basis, in response to the larger maximum energy threshold of light which can be received by the photoelectric conversion units 22, the area of overlapping regions between the second opening k2 and the first opening k1 can be correspondingly enlarged. On the contrary, in response to the smaller maximum energy threshold of light which can be received by the photoelectric conversion units 22, the area of overlapping regions between the second opening k2 and the first opening k1 can be correspondingly reduced.

It should be noted that, in this embodiment of the present disclosure, in the case that the orthographic projection of the second opening k2 on the base substrate 21 is connected to the orthographic projection of the first opening k1 on the base substrate 21, the structural relationship between the first shading pattern 23 and the second shading pattern 24 may not be clingy, that is, a preset distance is defined between the first shading pattern 23 and the second shading pattern 24 in a direction perpendicular to the base substrate 21. In this way, part of the light can be irradiated on the photoelectric conversion units 22.

In some embodiments, a shape of the first opening k1 in the first shading block 231 is the same as a shape of the second opening k2 in the second shading block 241, and a size of the first opening k1 in the first shading block 231 is equal to a size of the second opening k2 in the second shading block 241. That is, the first opening 1d and the second opening k2 are the same not only in shape, but also in size. Therefore, the orthographic projection of the second opening k2 on the base substrate 21 and the orthographic projection of the second opening k1 on the base substrate 21 may be called congruent graphics.

For example, both the first opening k1 and the second opening k2 may be squares or circles.

In some embodiments, the first opening k1 in the first shading block 231 may be different from the second opening k2 in the second shading block 241. For example, the shape of the first opening k1 and the second opening k2 may be at least one of various shapes such as rectangle, circle, prism, pentagon, hexagon, or the like. This is not limited in this embodiment of the present disclosure.

In this embodiment of the present disclosure, a material of the first shading pattern 23 as and a material of the second shading pattern 24 include any one of: molybdenum (Mo), aluminum (Al), and a composite metal consisting of molybdenum and aluminum.

In response to both the first shading pattern 23 and the second shading pattern 24 being made of the composite metal consisting of molybdenum and aluminum, the first shading pattern 23 as well as the second shading pattern 24 may be made of a three-layer composite metal layer composed of a molybdenum layer, an aluminum layer, and a molybdenum layer (for example, the first shading pattern and the second shading pattern may be made by processing the composite metal layer according to a composition process). The three-layer composite metal layer composed of the molybdenum layer, the aluminum layer, and the molybdenum layer has a better shading effect.

In response to both the first shading pattern 23 and the second shading pattern 24 being made of aluminum, the first shading pattern 23 as well as the second shading pattern 24 may be only made of an aluminum layer.

In response to both the first shading pattern 23 and the second shading pattern 24 being made of molybdenum, the first shading pattern 23 as well as the second shading pattern 24 may be only made of a molybdenum layer.

It should be noted that, the composition process in this embodiment of the present disclosure may include processes such as photoresist coating, exposure, development, etching, and photoresist stripping.

Figure 6:
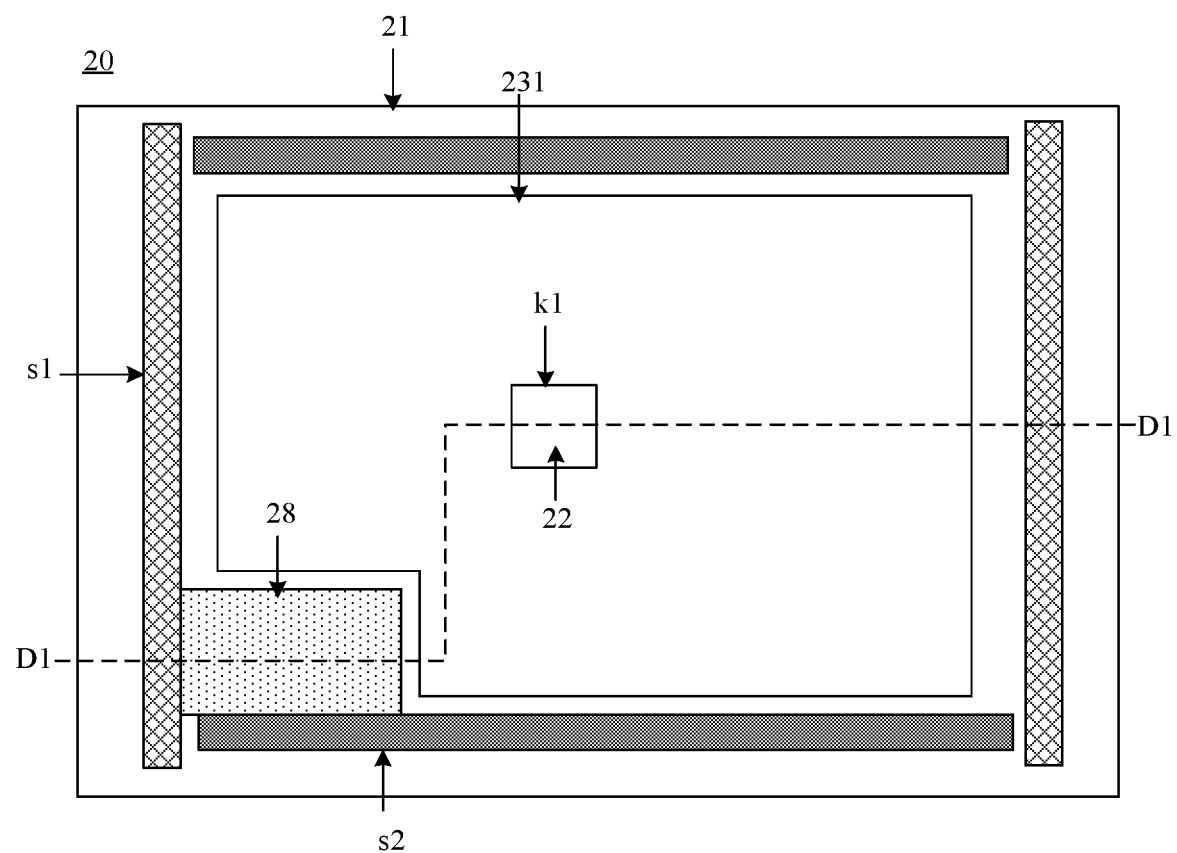
FIG. 6 is a schematic structural top view of a fingerprint acquisition apparatus according to an embodiment of the present disclosure.

FIG. 6 is a schematic structural top view of the fingerprint acquisition apparatus according to this embodiment of the present disclosure (the schematic structural top view may be a view observed from the top of the base substrate 21 toward the base substrate 21). For ease of description, the schematic structural top view only shows part of a structure of the photoelectric conversion unit 22, but does not constitute any limitation on this.

In some embodiments, the fingerprint acquisition apparatus 20 may further include a plurality of signal lines s1, a plurality of grid lines s2 and a plurality of thin film transistors 28 which are disposed on the base substrate 21. The plurality of signal lines s1 and the plurality of grid lines s2 may be crisscrossed, and divide the base substrate 21 into a plurality of pixel areas. Each pixel area may include one photoelectric conversion unit 22.

An electrode of the thin film transistor 28 may be electrically connected to the signal line s1 and the grid line s2. The thin film transistor 28 may be configured to control the photoelectric conversion unit 22 and acquire an electrical signal of the photoelectric conversion unit 22.

The first shading block 231 includes a first opening k1. The target photoelectric conversion unit 22 under the first shading block 231 is exposed at the first opening k1. Therefore, light can be irradiated on the target photoelectric conversion unit 22 through the first opening k1.

Figure 7:
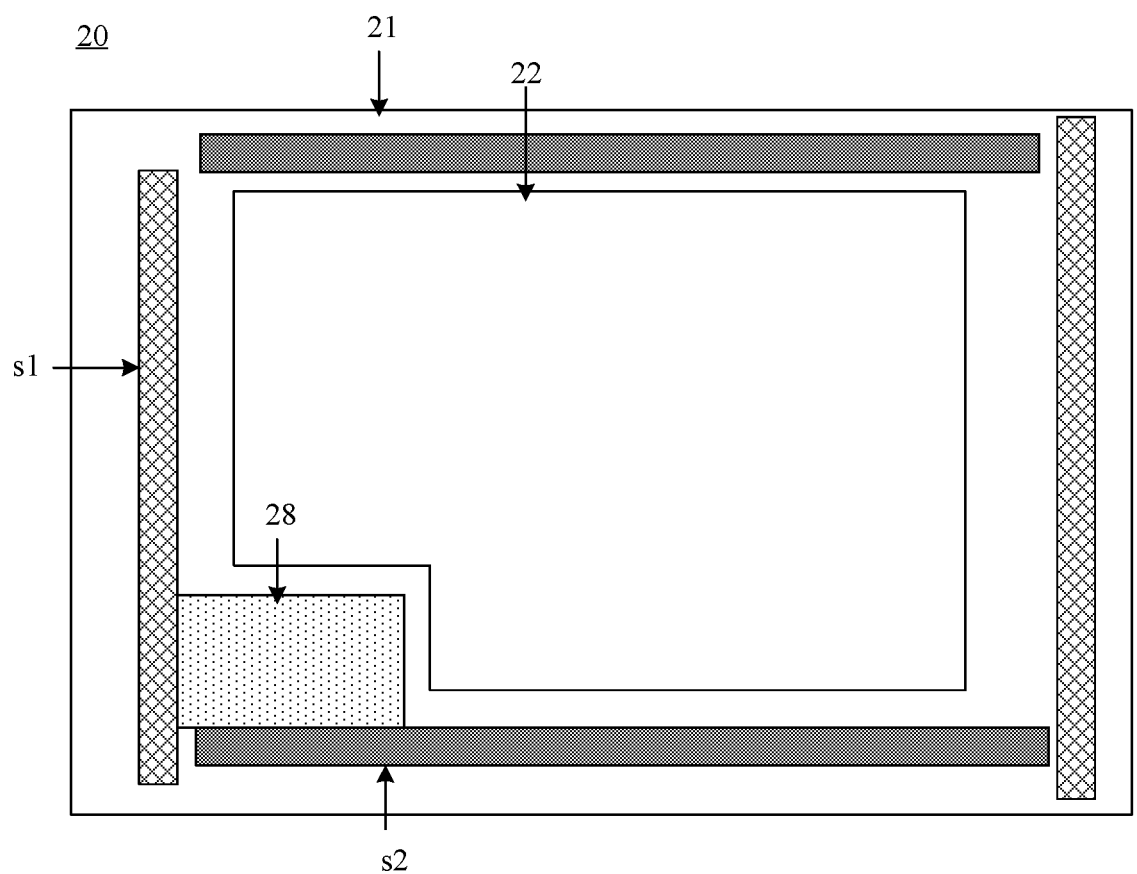
FIG. 7 is a schematic structural diagram of the fingerprint acquisition apparatus shown in FIG. 6 with a first shading block not shown.

A size of the target photoelectric conversion unit 22 under the first shading block 231 may be slightly smaller than a size of the first shading block 231. For example, FIG. 7 is a schematic structural diagram of the fingerprint acquisition apparatus 20 shown in FIG. 6 with the first shading block 231 not shown. Referring to FIG. 7, the target photoelectric conversion unit 22 occupies a large region of a pixel region. In this way, the size of the target photoelectric conversion unit 22 is larger, and the maximum energy threshold of light which can be received by the target photoelectric conversion unit 22 in unit time is larger. Therefore, a high-intensity light-resistant capability of the target photoelectric conversion unit 22 is improved.

Figure 8:
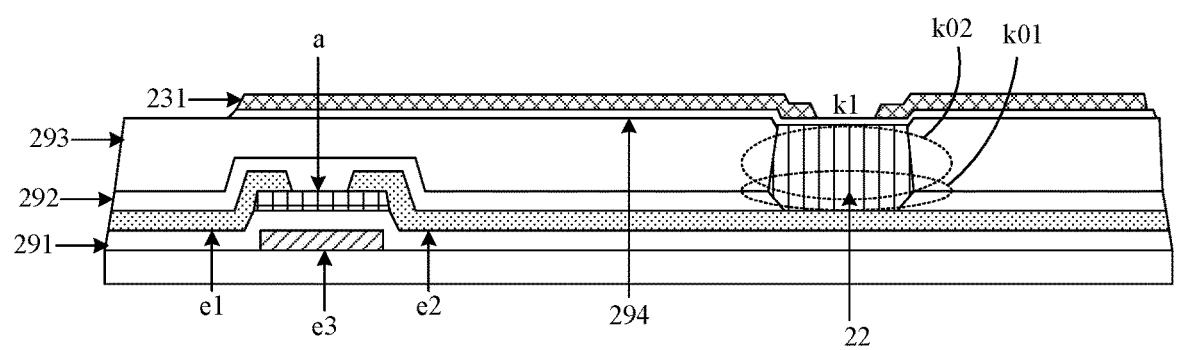
FIG. 8 is a schematic sectional view of the fingerprint acquisition apparatus shown in FIG. 6.

FIG. 8 is a schematic sectional view of D1-D1 in the fingerprint acquisition apparatus shown in FIG. 6. Referring to FIG. 8, the fingerprint acquisition apparatus 20 may further include a plurality of thin film transistors disposed on the base substrate.

Each of thin film transistors may include a first electrode e1, a second electrode e2, and a third electrode e3 configured to control connection or disconnection between the first electrode e1 and the second electrode e2, and the target photoelectric conversion unit 22 is electrically connected to the second electrode e2. One of the first electrode e1 and the second electrode e2 is a source electrode and the other is a drain electrode, and one of them may be electrically connected to the signal line s1, and the other may be electrically connected to the target photoelectric conversion unit 22. The third electrode e3 is a grid electrode and may be electrically connected to the grid line s2.

In addition, the thin film transistor further includes an active layer a disposed on one side, distal from the base substrate 21, of the third electrode e3. Both the first electrode e1 and the second electrode e2 are lapped on the active layer a. A path may be formed in the active layer a by supplying power to the third electrode e3 to connect the first electrode e1 and the second electrode e2.

In some embodiments, referring to FIG. 8, the fingerprint acquisition apparatus 20 may further include a grid insulation layer 291 disposed between the active layer a and the gird electrode e3, and a first insulation layer 292 disposed on the grid insulation layer 291. The first insulation layer 292 may include an opening k01. One electrode (for example, a positive electrode) of the photoelectric conversion unit 22 may be electrically connected to the second electrode e2 of the thin film transistor through the opening k01.

In some embodiments, referring to FIG. 8, the fingerprint acquisition apparatus 20 may further include a transparent flattening layer 293 on which the photoelectric conversion unit 22 is formed. An opening 1402 is formed in the photoelectric conversion unit 22 of the flattening layer 293, such that an upper part of the photoelectric conversion unit 22 is exposed. The flattening layer 293 may be configured to make each part of the base substrate 21 flat. A material of the flattening layer 293 may include resin.

In some embodiments, referring to FIG. 8, the fingerprint acquisition apparatus 20 may further include a common electrode 294 disposed on the base substrate 21, wherein the common electrode 294 is electrically connected to the plurality of photoelectric conversion units 22. The common electrode 294 may be configured as a common cathode of the plurality of photoelectric conversion units 22, and is electrically connected to a cathode of each photoelectric conversion unit 22. A material of the common electrode 294 may include indium tin oxide.

Figure 9:
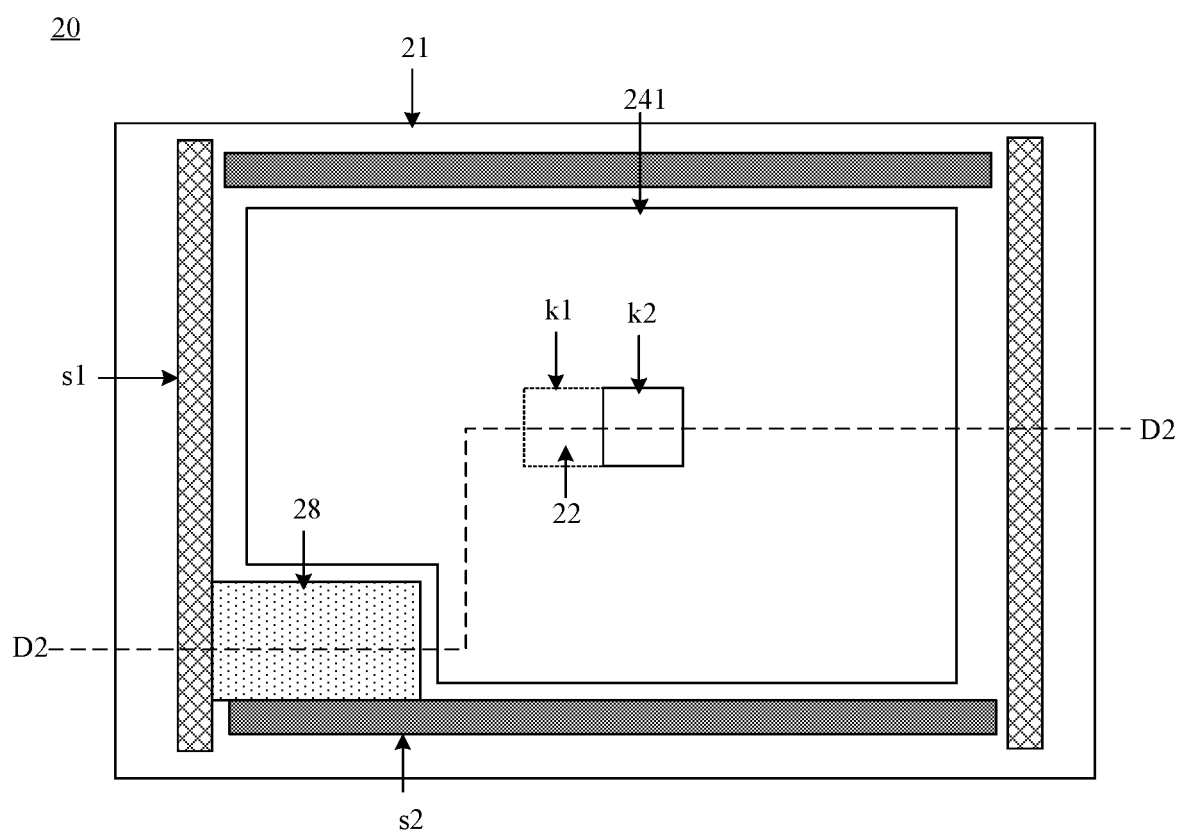
FIG. 9 is a schematic structural top view of a fingerprint acquisition apparatus according to an embodiment of the present disclosure.

FIG. 9 is a schematic structural top view of the fingerprint acquisition apparatus according to this embodiment of the present disclosure (the schematic structural top view may be a view observed from the top of the base substrate 21 toward the base substrate 21). For ease of description, the schematic structural top view only shows part of a structure of the photoelectric conversion unit, but does not constitute any limitation on this.

In FIG. 9, a dotted box shows the first opening k1 in the first shading block 231 under the second shading block 241. The second opening k2 in the second shading block 241 is adjacent to the first opening k1. FIG. 9 shows an embodiment in which the first opening k1 in the first shading block 231 and the second opening k2 in the second shading block 241 are completely staggered. In some embodiments, there may be overlapping regions between the first opening k1 and the second opening k2 in the second shading block 241. This is not limited in this embodiment of the present disclosure.

Figure 10:
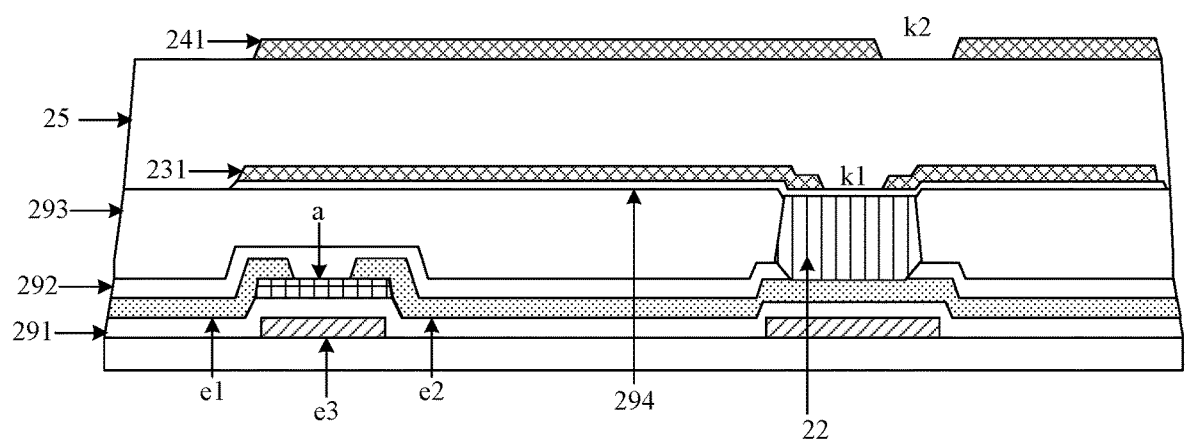
FIG. 10 is a schematic sectional view of the fingerprint acquisition apparatus shown in FIG. 9.

FIG. 10 is a schematic sectional view of D2-D2 in the fingerprint acquisition apparatus shown in FIG. 9. Referring to FIG. 10, the fingerprint acquisition apparatus may further include a transparent spacer layer 25.

The transparent spacer layer 25 is disposed between the first shading pattern 23 and the second shading pattern 24. The transparent spacer layer 25 may be configured to adjust a distance between the first shading pattern 23 and the second shading pattern 24, thereby adjusting energy of light radiated on the target photoelectric conversion unit 22 through the second opening k2 and the first opening k1 in unit time.

In some embodiments, a material of the transparent spacer layer 25 may include resin. For example, the resin may be optical resin. The resin can form a film with high transmittance.

The fingerprint acquisition apparatus shown in FIG. 10 may further include another structure. For example, FIG. 11 is a schematic structural diagram of still another fingerprint acquisition apparatus according to an embodiment of the present disclosure.

Figure 11:
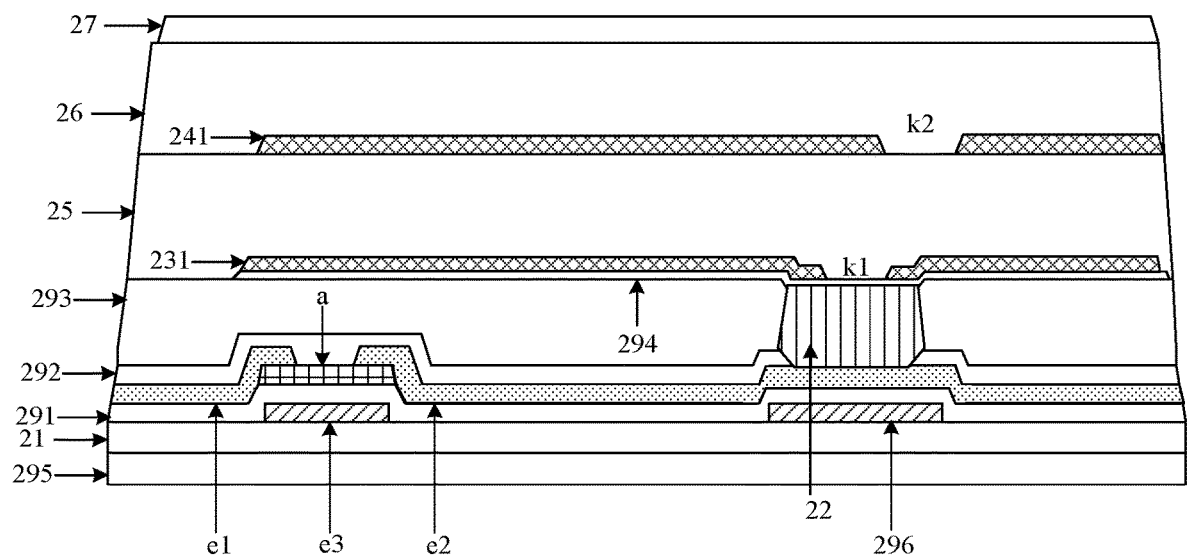
FIG. 11 is a schematic structural diagram of still another fingerprint acquisition apparatus according to an embodiment of the present disclosure.

Referring to FIG. 11, the fingerprint acquisition apparatus 20 may further include a transparent insulation layer 26 and a transparent conductive layer 27 which are disposed on the base substrate 21.

The transparent conductive layer 27 is electrically connected to a grounding point (GND) not illustrated in FIG. 11. The transparent conductive layer 27 may be configured as electro-static discharge (electro-static discharge, ESD) of the fingerprint acquisition apparatus, such that all electrostatic protection capability of the fingerprint acquisition apparatus is improved.

In some embodiments, a material of the transparent conductive layer 27 may include a transparent metal. For example, the transparent metal may be indium tin oxide (ITO).

In some embodiments, a material of the first shading pattern 23 may include metal; and the first shading pattern 23 may be disposed on the common electrode 294 and electrically connected to the common electrode 294. In this case, the first shading pattern 23 and the common electrode 294 may transmit cathode signals together.

In some embodiments, referring to FIG. 11, the fingerprint acquisition apparatus 20 may further include a backlight plate 295. The backlight plate 295 is disposed on one side, distal from the plurality of photoelectric conversion units 22, of the base substrate 21.

In some embodiments, the backlight plate 295 may include a light guide plate and a light-emitting unit disposed on one side of the light guide plate, thereby providing a surface light source.

In some embodiments, a material of the second electrode e2 may include a shading conductive material, that is, the second electrode e2 may be made of the shading conductive material. The photoelectric conversion unit 22 may be disposed on the second electrode e2. An orthographic projection of the photoelectric conversion unit 22 on the backlight plate 295 may be within an orthographic projection of the second electrode e2 on the backlight plate 295. In this structure, the second electrode e2 may be configured as a shielding structure, to prevent light emitted from the backlight plate 295 from being directly irradiated on the photoelectric conversion unit 22. The second electrode e2 may be made of a composite film composed consisting of a molybdenum layer and an aluminum layer.

In some embodiments, referring to FIG. 11, the fingerprint acquisition apparatus 20 may further include a shading sheet 296 arranged on the same layer as the third electrode e3.

The orthographic projection of the photoelectric conversion unit 22 on the backlight plate 295 may be within an orthographic projection of the shading sheet 296 on the backlight plate 295. The shading sheet 296 may be coordinated with the second electrode e2 to prevent the light emitted from the backlight plate 295 from being directly irradiated on the photoelectric conversion unit 22.

In addition, because the shading sheet 296 and the third electrode e3 are arranged on the same layer, the shading sheet 296 and the third electrode e3 may be formed from the same metal layer by a single composition process. This not only reduces manufacturing processes, but also simplifies a structure of the fingerprint acquisition apparatus.

In the above described drawings, each first shading block 231 corresponding to the photoelectric conversion unit 22 includes one opening, and each second shading block 241 also includes one opening. However, each first shading block 231 and each second shading block 241 may include more openings.

In some embodiments, the first shading block 231 may further include at least one third opening. An orthographic projection of the at least one third opening on the base substrate 21 may be within an orthographic projection of a target photoelectric conversion unit 22 on the base substrate 21.

In some embodiments, the second shading block 241 may further include at least one fourth opening in one-to-one correspondence with the at least one third opening. An orthographic projection of the fourth opening on the base substrate 21 is connected to an orthographic projection of the third opening on the base substrate 21. Alternatively, the orthographic projection of the fourth opening on the base substrate 21 is overlapped with the orthographic projection of the third opening on the base substrate 21.

In this structure, energy of light radiated on the target photoelectric conversion unit 22 in unit time can be adjusted by adjusting quantities of openings in the first shading block 231 and the second shading block 241.

In the fingerprint acquisition apparatus according to this embodiment of the present disclosure, the base substrate 21 and a structure on one side, proximal to the photoelectric conversion unit 22, of the base substrate 21 may form a fingerprint sensor. The backlight plate 295 is configured to provide a light source for the fingerprint sensor. The fingerprint acquisition apparatus may further include a control assembly. The control assembly may include a control integrated circuit (IC). The control assembly may be electrically connected to a plurality of thin film transistors and may be configured to control the plurality of thin film transistors.

Figure 12:
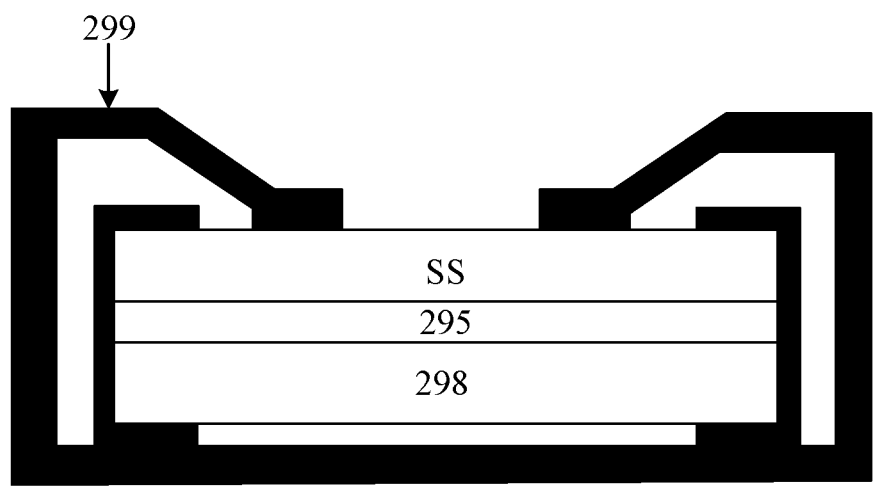
FIG. 12 is a schematic structural diagram of still another fingerprint acquisition apparatus according to an embodiment of the present disclosure.

In some embodiments, FIG. 12 is a schematic structural diagram of a further fingerprint acquisition apparatus according to an embodiment of the present disclosure. The fingerprint acquisition apparatus may further include a control circuit board 298. The control circuit board 298 may be disposed on one side, distal from the base substrate, of the backlight plate 295, The sensor SS may include the base substrate and the structure on the side, proximal to the photoelectric conversion unit, of the base substrate in the fingerprint acquisition apparatus according to the above embodiment. The control circuit board 298 may be electrically connected to the backlight plate 295 and the control assembly in the sensor SS, so as to control the sensor SS and the backlight plate 295.

For example, the control circuit board 298 may include a field programmable gate array (FPGA).

In some embodiments, the fingerprint acquisition apparatus may further include a shell 299. The control circuit board 298, the backlight plate 295 and the sensor SS may be all disposed in the shell 299. The shell 299 can protect various structures therein to prolong the service life of the fingerprint acquisition apparatus.

In summary, the fingerprint acquisition apparatus according to this embodiment of the present disclosure includes the photoelectric conversion units and the shading pattern on the photoelectric conversion units; and the shading pattern includes openings. As the shading pattern shields a large area of the photoelectric conversion units, light can only be irradiated on the photoelectric conversion units through the openings. In this way, the light irradiated on the photoelectric conversion units is greatly reduced, and the energy of light radiated on the photoelectric conversion units does not exceed the maximum threshold which can be accepted by the photoelectric conversion units, thus a high-intensity light-resistant capability of the fingerprint acquisition apparatus is improved. Furthermore, it reduces the possibility that the photoelectric conversion units malfunction when external high-intensity light is irradiated on them.

In addition, because the fingerprint acquisition apparatus does not require any prism or prism-based light path, that is, the fingerprint acquisition apparatus does not require any prism structure to resist high-intensity light; an overall structure of the fingerprint acquisition apparatus is simpler, smaller and thinner. Therefore, the fingerprint acquisition apparatus can be applicable to various thin devices conveniently, and its applicable range is greatly enlarged. In other words, a problem of large overall size and thickness of a fingerprint acquisition apparatus in the related art is solved, and an overall thickness of the fingerprint acquisition apparatus is reduced.

Figure 13:
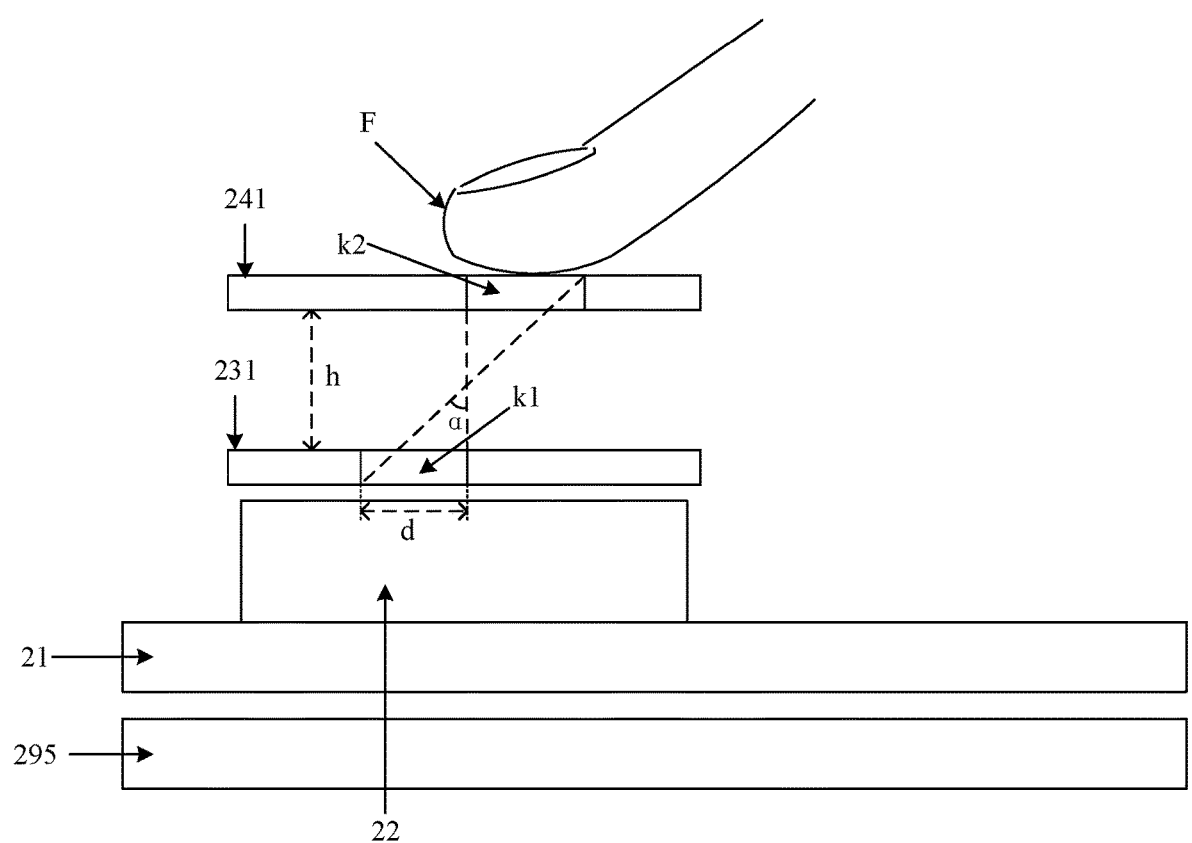
FIG. 13 is a schematic diagram of an application structure of the fingerprint acquisition apparatus shown in FIG. 4.

In an example embodiment, as shown in FIG. 13, FIG. 13 is a schematic diagram of an application structure of the fingerprint acquisition apparatus shown in FIG. 4. In FIG. 13, the first opening k1 and the second opening k2 are rectangular openings that are the same in shape and size and whose side lengths are d. In a direction perpendicular to the base substrate 21, a distance between the first shading block 231 and the second shading block 241 is h. The maximum incidence angle of the external light which can be irradiated on the target photoelectric conversion unit 22 through the first opening k1 and the second opening k2 is $\alpha$.

Based on some current manufacturing processes, a pixel pitch of the fingerprint acquisition apparatus may be 50.8 μm. The pixel pitch may refer to the pitch between centers of two adjacent target photoelectric conversion units 22. Considering widths and spacing of the gate lines and the signal lines, the minimum distance between the adjacent target photoelectric conversion units 22 may be greater than or equal to 17 μm. Light reflected from estimated valleys and ridges of a finger may be distinguished by the plurality of photoelectric conversion units 22, and external light does not greatly affect the photoelectric conversion units. h may range from 3 μm to 10 μm (in the fingerprint acquisition apparatus shown in FIG. 11, h may be a thickness of the transparent spacer layer 25).

In the case that h is 10 pin, in response to the rectangular orthographic projection of the photoelectric conversion unit 22 on the base substrate, a length and a width of the photoelectric conversion unit 22 (the length and width are dimensions of the photoelectric conversion unit parallel to the base substrate) may range from 3.6 μm to 8.3 μm. An orthographic projection of the first opening k1 in the first shading block 231 on the base substrate 21 may occupy 3% of the region of an orthographic projection of the photoelectric conversion unit 22 on the base substrate 21, that is, the first shading block 231 may produce a 97% shielding effect, thereby meeting a requirement of high-intensity light-resistant.

In some embodiments, in the case that the optoelectronic conversion unit 22 on the base substrate is a square with a side length of 32 μm and an area of 1024 μm$^2$, an area of the first shading block 231 may be 994 μm; and the first opening k1 in the first shading block 231 may be a square opening with a side length of less than 5.5 μm. In the case that ii is 3 μm, the angle $\alpha$ is approximately 74.5°.

Figure 14:
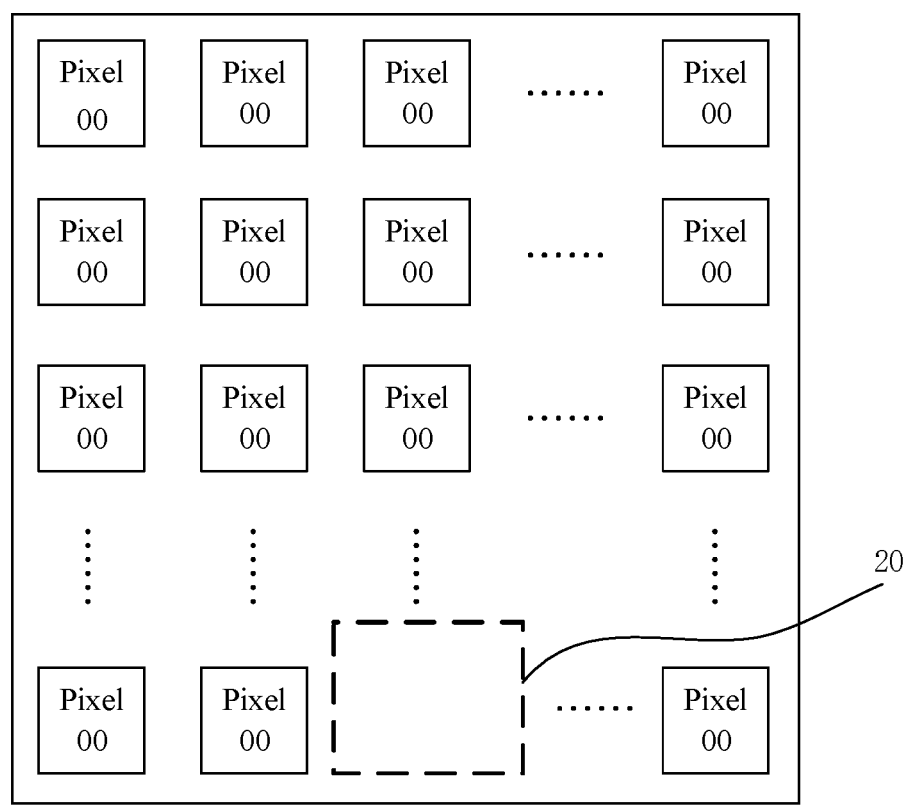
FIG. 14 is a schematic structural diagram of a display panel according to an embodiment of the present disclosure.

In addition, an embodiment of the present disclosure further provides a display panel. As shown in FIG. 14, the display panel may include a plurality of pixels 00 and a fingerprint acquisition apparatus 20, wherein the fingerprint acquisition apparatus 20 may be any fingerprint acquisition apparatus 20 according to the above embodiments, and the plurality of pixels 00 are configured to display images.

Figure 15:
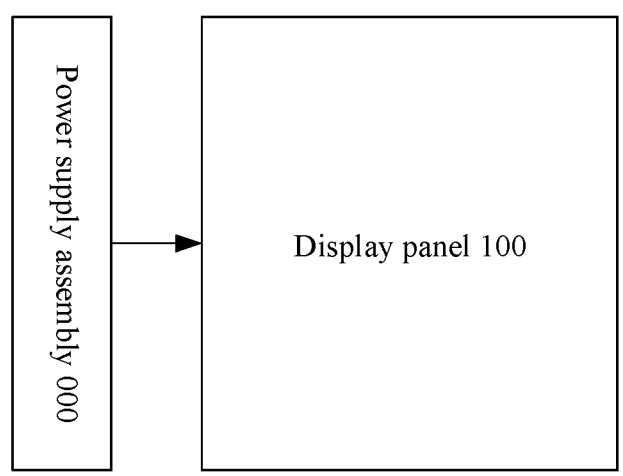
FIG. 15 is a schematic structural diagram of a display apparatus according to an embodiment of the present disclosure.

In addition, an embodiment of the present disclosure further provides an electronic device. As shown in FIG. 15, the electronic device may include a power supply assembly 000 and the display panel 100 according to the above embodiments. The power supply assembly 000 may be electrically connected to the display panel 100 and may be configured to supply power to the display panel 100.

In some embodiments, the fingerprint acquisition apparatus 20 may be disposed at a periphery of a display screen of the electronic device, or on an edge of the electronic device. The fingerprint acquisition apparatus 20 may be conveniently disposed in the electronic device due to the smaller volume of the fingerprint acquisition apparatus according to the above embodiments, which may be less than one-tenth of a volume of the fingerprint acquisition apparatus including the prism.

In some embodiments, the electronic device may be a display device. The display device may include a mobile phone, a tablet computer, a notebook computer, a desktop computer, or another device with display functions. Alternatively, the electronic device may be other devices that are to provide fingerprint acquisition functions, such as a security product, an electronic punch card machine, an intelligent safe, and an intelligent door lock.

In the embodiments of the present disclosure, the term "at least one of A and B" is merely an association relationship that describes associated objects, and indicates three relationships. For example. "at least one of A and B" may indicate three cases: only A exists, both A and B exist, and only B exists. Similarly, "at least one of A, B, and C" indicates seven relationships: only A exists, only B exists, only C exists, both A and B exist, both A and C exist, both C and B exist, and all of A, B, and C exist. Similarly, "at least one of A, B, C, and D" indicates fifteen relationships: only A exists, only B exists, only C exists, only D exists, both A and B exist, both A and C exist, both. A and D exist, both C and B exist, both D and B exist, both C and D exist, all of A, B, and C exist, all of A, B, and D exist, all of A, C, and D exist, all of B, C, and D exist, and all of A, B, C, and D exist.

It should be pointed out that, in the accompanying drawings, sizes of layers and regions may be exaggerated for clarity of illustration. In addition, it is to be understood that, when an element or layer is referred to "on" another element or layer, it may be on the other element or layer, or there may be an intervening layer. Alternatively, it is to be understood that, in the case that an element or layer is "under" another element or layer, it may be under the other element or layer, or there may be more than one intervening element or layer between them. In addition, it is to be understood that, in the case that a layer or element is "between" two layers or elements, it may be the only layer or element disposed between the two layers or elements, or more than one intervening layer or element is disposed between the two layers or two elements. In the entire specification, similar reference marks indicate similar elements.

In the embodiments of the present disclosure, the terms "first," "second," "third," and "fourth" are only used for descriptive purposes and cannot be understood as indicating or implying relative importance. Unless otherwise defined, the term "a plurality of" refers to two or more.

The above descriptions are merely exemplary embodiments of the present disclosure, but are not intended to limit the present disclosure. Any modifications, equivalent replacements, or improvements and the like made within the spirit and principles of the present disclosure should be included within the protection scope of the present disclosure.

What is claimed is:

1. A fingerprint acquisition apparatus, comprising:
a base substrate;
a plurality of photoelectric conversion units disposed on the base substrate; and
a first shading pattern disposed on the base substrate;
wherein the first shading pattern comprises at least one first shading block corresponding to at least one target photoelectric conversion unit of the plurality of photoelectric conversion units, the first shading block comprising a first opening, wherein an orthographic projection of the first opening in the first shading block on the base substrate is within an orthographic projection of the target photoelectric conversion unit corresponding to the first shading block on the base substrate;
further comprising a plurality of thin film transistors disposed on the base substrate; wherein each of the thin film transistors comprises a first electrode, a second electrode, and a third electrode configured to control connection or disconnection between the first electrode and the second electrode, wherein the second electrode is electrically connected to one of the plurality of photoelectric conversion units; and
a backlight plate disposed on one side, distal from the plurality of photoelectric conversion units, of the base substrate; wherein a material of the second electrode comprises a shading conductive material, the photoelectric conversion unit electrically connected to the second electrode is disposed on the second electrode, and an orthographic projection of the photoelectric conversion unit electrically connected to the second electrode on the backlight plate is within an orthographic projection of the second electrode on the backlight plate.

2. The apparatus according to claim 1, further comprising:
a second shading pattern disposed on the base substrate; wherein
the second shading pattern comprises at least one second shading block corresponding to the at least one first shading block, the second shading block comprising a second opening, wherein a positional relationship between an orthographic projection of the second opening in the second shading block on the base substrate and an orthographic projection of the first opening in the first shading block corresponding to the second shading block on the base substrate satisfies any one of the following conditions:
the orthographic projection of the second opening in the second shading block on the base substrate is connected to the orthographic projection of the first opening in the first shading block corresponding to the second shading block on the base substrate; and
the orthographic projection of the second opening in the second shading block on the base substrate is overlapped with the orthographic projection of the first opening in the first shading block corresponding to the second shading block on the base substrate.

3. The fingerprint acquisition apparatus according to claim 2, wherein a gap is defined between the first shading pattern and the second shading pattern in a direction perpendicular to the base substrate.

4. The fingerprint acquisition apparatus according to claim 2, further comprising: a transparent spacer layer disposed between the first shading pattern and the second shading pattern.

5. The fingerprint acquisition apparatus according to claim 2, wherein a shape of the first opening in the first shading block is the same as a shape of the second opening in the second shading block, and a size of the first opening in the first shading block is equal to a size of the second opening in the second shading block.

6. The fingerprint acquisition apparatus according to claim 2, wherein the first shading block further comprises at least one third opening, wherein an orthographic projection of the at least one third opening on the base substrate is within an orthographic projection of the target photoelectric conversion unit on the base substrate.

7. The fingerprint acquisition apparatus according to claim 6, wherein the second shading block further comprises at least one fourth opening in one-to-one correspondence with the at least one third opening, wherein a positional relationship between an orthographic projection of the fourth opening on the base substrate and an orthographic projection of the third opening corresponding to the fourth opening on the base substrate satisfies any one of the following conditions:
the orthographic projection of the fourth opening on the base substrate is connected to the orthographic projection of the third opening corresponding to the fourth opening on the base substrate; and
the orthographic projection of the fourth opening on the base substrate is overlapped with the orthographic projection of the third opening corresponding to the fourth opening on the base substrate.

8. The fingerprint acquisition apparatus according to claim 7, wherein a gap is defined between the first shading pattern and the second shading pattern in a direction perpendicular to the base substrate; the fingerprint acquisition apparatus further comprises: a transparent spacer layer disposed between the first shading pattern and the second shading pattern; a shape of the first opening in the first shading block is the same as a shape of the second opening in the second shading block, a size of the first opening in the first shading block is equal to a size of the second opening in the second shading block, and each of the plurality of photoelectric conversion units is the target photoelectric conversion unit; and
the fingerprint acquisition apparatus further comprises:
a transparent insulation layer and a transparent conductive layer disposed on the base substrate, wherein the transparent conductive layer is electrically connected to a grounding point;
a common electrode disposed on the base substrate, wherein the common electrode is electrically connected to the plurality of photoelectric conversion units, a material of the first shading pattern comprises metal, and the first shading pattern is disposed on and electrically connected to the common electrode;
a control assembly, and a control circuit board disposed on one side, distal from the base substrate, of the backlight plate, wherein the control circuit board is electrically connected to the backlight plate and the control assembly and configured to control the backlight plate and the control assembly, and the control assembly is further electrically connected to the plurality of thin film transistors and configured to control the plurality of thin film transistors; and a shading sheet arranged on the same layer as the third electrode, wherein an orthographic projection of the photoelectric conversion unit electrically connected to the second electrode on the backlight plate is within an orthographic projection of the shading sheet on the backlight plate; and a material of the first shading pattern and a material of the second shading pattern comprise any one of: molybdenum, aluminum, and a composite metal of molybdenum and aluminum.

9. The fingerprint acquisition apparatus according to claim 1, wherein each of the plurality of photoelectric conversion units is the target photoelectric conversion unit.

10. The fingerprint acquisition apparatus according to claim 2, further comprising:
a transparent insulation layer disposed on the base substrate; and
a transparent conductive layer disposed on the base substrate, wherein the transparent conductive layer is electrically connected to a grounding point.

11. The fingerprint acquisition apparatus according to claim 1, further comprising: a common electrode disposed on the base substrate, wherein the common electrode is electrically connected to the plurality of photoelectric conversion units.

12. The fingerprint acquisition apparatus according to claim 11, wherein a material of the first shading pattern comprises metal, and the first shading pattern is disposed on the common electrode and electrically connected to the common electrode.

13. The fingerprint acquisition apparatus according to claim 1, wherein the backlight plate comprises: a light guide plate and a light-emitting unit disposed on one side of the light guide plate.

14. The fingerprint acquisition apparatus according to claim 1, further comprising: a control assembly, and a control circuit board disposed on one side, distal from the base substrate, of the backlight plate;
wherein the control circuit board is electrically connected to the backlight plate and the control assembly and configured to control the backlight plate and the control assembly, and the control assembly is further electrically connected to the plurality of thin film transistors and configured to control the plurality of thin film transistors.

15. The fingerprint acquisition apparatus according to claim 1, further comprising: a shading sheet arranged on a same layer as the third electrode, wherein an orthographic projection of the photoelectric conversion unit electrically connected to the second electrode on the backlight plate is within an orthographic projection of the shading sheet on the backlight plate.

16. The fingerprint acquisition apparatus according to claim 2, wherein a material of the first shading pattern and a material of the second shading pattern comprise any one of:
molybdenum, aluminum, and a composite metal of molybdenum and aluminum.

17. A display panel, comprising a plurality of pixels and a fingerprint acquisition apparatus, wherein the fingerprint acquisition apparatus comprises:

a base substrate;
a plurality of photoelectric conversion units disposed on the base substrate; and
a first shading pattern disposed on the base substrate;
wherein the first shading pattern comprises at least one first shading block corresponding to at least one target photoelectric conversion unit of the plurality of photoelectric conversion units, the first shading block comprising a first opening, wherein an orthographic projection of the first opening in the first shading block on the base substrate is within an orthographic projection of the target photoelectric conversion unit corresponding to the first shading block on the base substrate;
the fingerprint acquisition apparatus further comprises a plurality of thin film transistors disposed on the base substrate; wherein each of the thin film transistors comprises a first electrode, a second electrode, and a third electrode configured to control connection or disconnection between the first electrode and the second electrode, wherein the second electrode is electrically connected to one of the plurality of photoelectric conversion units; and
a backlight plate disposed on one side, distal from the plurality of photoelectric conversion units, of the base substrate; wherein a material of the second electrode comprises a shading conductive material, the photoelectric conversion unit electrically connected to the second electrode is disposed on the second electrode, and an orthographic projection of the photoelectric conversion unit electrically connected to the second electrode on the backlight plate is within an orthographic projection of the second electrode on the backlight plate.

18. An electronic device, comprising a display panel and a power supply assembly, wherein the power supply assembly is electrically connected to the display panel and configured to supply power to the display panel;
the display panel comprises a plurality of pixels and a fingerprint acquisition apparatus, wherein
the fingerprint acquisition apparatus comprises:
a base substrate;
a plurality of photoelectric conversion units disposed on the base substrate; and
a first shading pattern disposed on the base substrate;
wherein the first shading pattern comprises at least one first shading block corresponding to at least one target photoelectric conversion unit of the plurality of photoelectric conversion units, the first shading block comprising a first opening, wherein an orthographic projection of the first opening in the first shading block on the base substrate is within an orthographic projection of the target photoelectric conversion unit corresponding to the first shading block on the base substrate;
the fingerprint acquisition apparatus further comprises a plurality of thin film transistors disposed on the base substrate; wherein each of the thin film transistors comprises a first electrode, a second electrode, and a third electrode configured to control connection or disconnection between the first electrode and the second electrode, wherein the second electrode is electrically connected to one of the plurality of photoelectric conversion units; and
a backlight plate disposed on one side, distal from the plurality of photoelectric conversion units, of the base substrate; wherein a material of the second electrode comprises a shading conductive material, the photoelectric conversion unit electrically connected to the second electrode is disposed on the second electrode, and an orthographic projection of the photoelectric conversion unit electrically connected to the second electrode on the backlight plate is within an orthographic projection of the second electrode on the backlight plate.

* * * * *